United States Patent
Gruetzmacher et al.

(10) Patent No.: US 11,897,231 B2
(45) Date of Patent: Feb. 13, 2024

(54) PACKAGE FILM HAVING FOIL LAYERS WITH INTERVENING MULTILAYER STRUCTURE

(71) Applicant: AMCOR FLEXIBLES NORTH AMERICA, INC., Neenah, WI (US)

(72) Inventors: Ross K Gruetzmacher, Neenah, WI (US); Brent G. Martins, Oshkosh, WI (US)

(73) Assignee: AMCOR FLEXIBLES NORTH AMERICA, INC., Neenah, WI (US)

(*) Notice: Subject to any disclaimer, the term of this patent is extended or adjusted under 35 U.S.C. 154(b) by 459 days.

(21) Appl. No.: 16/309,538

(22) PCT Filed: Jun. 15, 2016

(86) PCT No.: PCT/US2016/037617
§ 371 (c)(1),
(2) Date: Dec. 13, 2018

(87) PCT Pub. No.: WO2017/217980
PCT Pub. Date: Dec. 21, 2017

(65) Prior Publication Data
US 2019/0315095 A1     Oct. 17, 2019

(51) Int. Cl.
*B32B 27/08*     (2006.01)
*B32B 15/085*     (2006.01)
(Continued)

(52) U.S. Cl.
CPC ............ *B32B 15/085* (2013.01); *B32B 15/20* (2013.01); *B32B 27/08* (2013.01); *B32B 27/32* (2013.01);
(Continued)

(58) Field of Classification Search
CPC ...... B32B 15/08; B32B 15/082; B32B 15/085; B32B 15/088; B32B 15/09; B32B 15/20;
(Continued)

(56) References Cited

U.S. PATENT DOCUMENTS 3,607,519 A * 9/1971 Serafino .................. B32B 27/00
156/190
3,950,480 A   4/1976 Adams et al.
(Continued)

FOREIGN PATENT DOCUMENTS

| JP | 2000309644 A | * | 11/2000 |
| WO | 2005100010 A1 | | 10/2005 |

(Continued)

OTHER PUBLICATIONS

Understanding biaxially and monoaxially oriented films, Packaging World, 2013. (Year: 2013).*
(Continued)

*Primary Examiner* — Callie E Shosho
*Assistant Examiner* — Krupa Shukla

(57) ABSTRACT

A package film is described. The package film comprises a first foil layer having a thickness of 0.5 mil or less but greater than 0 mil and a second foil layer having a thickness of 0.5 mil or less but greater than 0 mil. The package film also comprises a multilayer structure positioned between the first foil layer and the second foil layer. The multilayer structure has a thickness of from 0.75 mil to 2 mil and comprises (a) a high modulus layer having a secant modulus in each of the machine direction and the transverse direction of greater than 120,000 psi or having an elongation at break in each of the machine direction and the transverse direction of less than 150% and (b) a bulk layer comprising polyethylene, polypropylene, ionomer, or blends thereof. The package film further comprises a sealant film, and the sealant film (Continued)

is positioned interior the second foil layer. Various embodiments of the package film are also described.

20 Claims, 7 Drawing Sheets

(51) Int. Cl.
*B32B 15/20* (2006.01)
*B32B 27/32* (2006.01)
*B32B 29/00* (2006.01)
*B32B 37/12* (2006.01)
*B65D 65/14* (2006.01)
*H01L 23/50* (2006.01)

(52) U.S. Cl.
CPC ............ *B32B 29/002* (2013.01); *B32B 37/12* (2013.01); *B65D 65/14* (2013.01); *H01L 23/50* (2013.01); *B32B 2309/105* (2013.01); *B32B 2311/24* (2013.01)

(58) Field of Classification Search
CPC ............ B32B 2250/05; B32B 2255/06; B32B 2255/10; B32B 2255/26; B32B 2270/00; B32B 2307/31; B32B 2307/518; B32B 2307/54; B32B 2307/5825; B32B 2307/732; B32B 2309/105; B32B 2311/24; B32B 2435/02; B32B 27/08; B32B 27/32; B32B 27/34; B32B 27/36; B32B 29/002; B32B 37/12; B32B 7/022; B32B 7/12

See application file for complete search history.

(56) References Cited

U.S. PATENT DOCUMENTS

| | | | | |
|---|---|---|---|---|
| 4,259,412 A * | 3/1981 | Buzio | ................... | B32B 27/08 |
| | | | | 156/331.7 |
| 4,452,842 A | 6/1984 | Borges et al. | | |
| 4,498,390 A | 2/1985 | Bowling et al. | | |
| 4,784,885 A | 11/1988 | Carespodi | | |
| 5,158,831 A | 10/1992 | Schirmer | | |
| 5,283,118 A * | 2/1994 | Murakami | ................ | C09J 7/22 |
| | | | | 428/458 |
| 5,342,684 A | 8/1994 | Carespodi | | |
| 6,129,800 A | 10/2000 | Brinley | | |
| 6,337,113 B1 | 1/2002 | Muggli et al. | | |
| 6,589,616 B2 | 7/2003 | Muggli et al. | | |
| 6,953,512 B2 | 10/2005 | Cohen et al. | | |
| 8,945,702 B2 | 2/2015 | Wuest et al. | | |
| 2003/0032750 A1 | 2/2003 | Chang et al. | | |
| 2004/0016208 A1 * | 1/2004 | Mumpower | ............ | B32B 27/08 |
| | | | | 53/411 |
| 2005/0136220 A1 | 6/2005 | Park et al. | | |
| 2007/0042147 A1 | 2/2007 | Altman et al. | | |
| 2007/0275196 A1 * | 11/2007 | Opuszko | ............... | B32B 27/302 |
| | | | | 428/35.2 |
| 2009/0004505 A1 | 1/2009 | Carespodi | | |
| 2009/0110888 A1 | 4/2009 | Wuest et al. | | |
| 2011/0248036 A1 * | 10/2011 | Peplinski | ........... | B65D 81/3461 |
| | | | | 220/573.1 |
| 2011/0281096 A1 | 11/2011 | Enzinger et al. | | |
| 2013/0122280 A1 | 5/2013 | Yokota et al. | | |
| 2015/0064429 A1 | 3/2015 | Iwaya et al. | | |
| 2015/0283029 A1 | 10/2015 | Riis et al. | | |
| 2015/0360828 A1 * | 12/2015 | Forster | ................... | B32B 15/20 |
| | | | | 156/60 |
| 2016/0159541 A1 | 6/2016 | Brandl | | |

FOREIGN PATENT DOCUMENTS

WO 2013004417 A1 † 1/2013
WO 2014198765 A1 12/2014

OTHER PUBLICATIONS

Machine translation of JP-2000309644-A, retrieved Apr. 18, 2022. (Year: 2000).*
Barry A. Morris, et al., "Du Pont Packaging Resins; The Influence of Sealant Modulus on the Bending Stiffness of Multilayer Films", White Paper, pdf retreived online 2016.
Wikipedia, Thousandth of an inch, Dec. 23, 2019. Retrieved Mar. 16, 2020.https://en.wikipedia.org/wiki/Thousandth_of_an_inch.†
Wikipedia, Die cutting (web), Dec. 3, 2019. Retrieved Mar. 16, 2020. https://en.wikipedia.org/wiki/Die_cutting_(web).†
Wikipedia, Polyester, Mar. 12, 2020. Retrieved Mar. 16, 2020. https://en.wikipedia.org/wiki/Polyester.†
Matweb, Overview of materials for ABS/Polyester Alloy, Copyright 1996-2020. Retrieved Mar. 16, 2020.http://www.matweb.com/search/DataSheet.aspx?MatGUID=0c053bd2e382499a9b2b86d995851bc5&ckck=1.†

* cited by examiner
† cited by third party

PACKAGE FILM HAVING FOIL LAYERS WITH INTERVENING MULTILAYER STRUCTURE

The present application describes a package film having a first foil layer, a second foil layer, and a multilayer structure positioned between (or intervening) the first foil layer and the second foil layer. The multilayer structure comprises at least a high modulus layer and a bulk layer. Such package film may be embossed and may be used as an economic, environmentally-friendly die cut lidding material with minimal curl and sufficient material strength.

BACKGROUND

Current commercial package films for die cut lidding comprise heavy gauge (1.3 mil or 1.5 mil or greater) foil. Such foil is disadvantaged in terms of economics and environmental friendliness. US 2009/0004504 (Carespodi) discloses a film structure comprising a first foil layer and a second foil layer, a high modulus layer positioned between the first foil layer and the second foil layer, and a sealant film. However, the film structure disclosed in US 2009/0004504 does not sufficiently separate the first foil layer from the second foil layer or the high modulus layer from the sealant film. As a result, the film structure disclosed in US 2009/0004505 has an excessive embossed curl and has an excessive change in curl due to embossing (see, Comparative Example 3 below).

SUMMARY

What is needed is an economic, environmentally-friendly package film that may be used for die cut lidding and that exhibits minimal curl and sufficient material strength. Existing package films do not address these needs. These needs are met by the package film described in the present application.

In a first set of embodiments, this package film comprises a first foil layer having a thickness of 0.5 mil or less but greater than 0 mil and a second foil layer having a thickness of 0.5 mil or less but greater than 0 mil. In some embodiments, the first foil layer may have a thickness of from 0.25 mil to 0.5 mil and the second foil layer may have a thickness of from 0.25 mil to 0.5 mil.

In the first set of embodiments, the package film also comprises a multilayer structure positioned between the first foil layer and the second foil layer. The multilayer structure has a thickness of from 0.75 mil to 2 mil and comprises (a) a high modulus layer having a secant modulus in each of the machine direction and the transverse direction of greater than 120,000 psi or having an elongation at break in each of the machine direction and the transverse direction of less than 150% and (b) a bulk layer comprising polyethylene, polypropylene, ionomer, or blends thereof. In some embodiments, the high modulus layer may have a thickness of from 0.35 mil to 1 mil or may comprise biaxially oriented nylon film, biaxially oriented polyethylene terephthalate film, or biaxially oriented polypropylene film. In some embodiments, the bulk layer may have thickness of from 0.4 mil to 1 mil. In some embodiments, the high modulus layer may be positioned exterior the bulk layer and the bulk layer may be positioned interior the high modulus layer; while, in other embodiments, the bulk layer may be positioned exterior the high modulus layer and the high modulus layer may be positioned interior the bulk layer.

In the first set of embodiments, the package film further comprises a sealant film, and the sealant film is positioned interior the second foil layer. In some embodiments, the sealant film may comprise a blown film sealant, an extrusion coated sealant, or a heat seal lacquer. In the embodiments where the sealant film comprises a blown film sealant or an extrusion coated sealant, the sealant film may have a thickness of from 0.5 mil to 3 mil or a thickness of from mil to 1.5 mil.

In some embodiments of the first set of embodiments, a die cut lid may comprise the package film. In some embodiments, such die cut lid may be embossed.

In a second set of embodiments, the package film comprises a first foil layer having a thickness of from 0.25 mil to 0.5 mil and a second foil layer having a thickness of from 0.25 mil to 0.5 mil.

In the second set of embodiments, the package film also comprises a multilayer structure positioned between the first foil layer and the second foil layer. The multilayer structure has a thickness of from 0.75 mil to 2 mil and comprises (a) a high modulus layer having a secant modulus in each of the machine direction and the transverse direction of greater than 120,000 psi or having an elongation at break in each of the machine direction and the transverse direction of less than 150% and (b) a bulk layer comprising polyethylene, polypropylene, ionomer, or blends thereof. The high modulus layer is positioned exterior the bulk layer and the bulk layer is positioned interior the high modulus layer. In some embodiments, the high modulus layer has a thickness of from 0.35 mil to 1 mil and comprises biaxially oriented polyethylene terephthalate film. In some embodiments, the bulk layer has a thickness of from 0.4 mil to 1 mil.

In the second set of embodiments, the package film further comprises an adhesive layer positioned between the first foil layer and the high modulus layer and additionally comprises an extrusion coated sealant. The extrusion coated sealant is positioned interior the second foil layer. In some embodiments, the extrusion coated sealant has a thickness of from 0.75 mil to 1.5 mil.

In some embodiments of the second set of embodiments, the first foil layer may be coated with primer or indicia.

In some embodiments of the second set of embodiments, a die cut lid may comprise the package film. In some embodiments, such die cut lid may be embossed.

DETAILED DESCRIPTION

Figure 1:
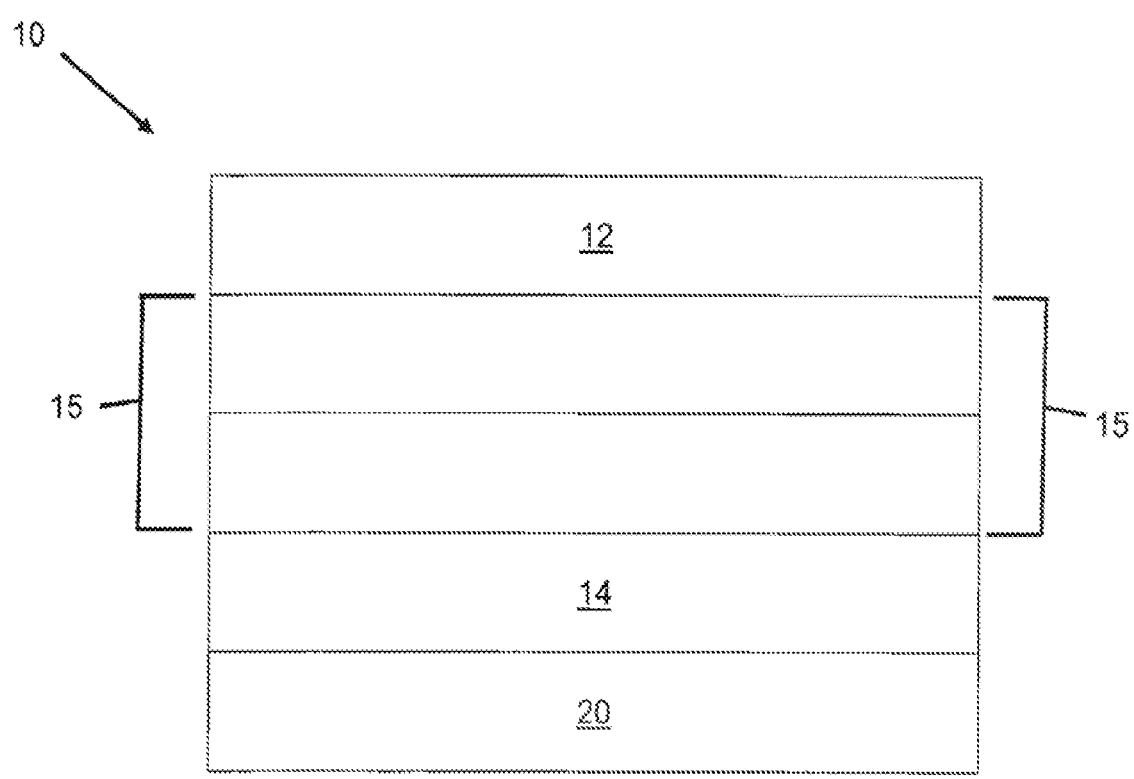
FIG. 1 is a schematic cross-sectional view of a first embodiment of a package film according to the present application.

Referring to the drawings, with some but not all embodiments shown, with elements depicted as illustrative and not necessarily to scale, and with the same (or similar) reference numbers denoting the same (or similar) features throughout the drawings, FIG. 1 is a schematic cross-sectional view of a first embodiment of a package film according to the present application.

As used throughout this application, the term "film" refers to a thermoplastic web of any thickness and is not limited to a thermoplastic web having a thickness of less than 10 mil. The term "sheet" refers to a thermoplastic web of any thickness and is not limited to a thermoplastic web having a thickness of greater than 10 mil. As used throughout this application, the term "thermoplastic" refers to a polymer or polymer mixture that softens when exposed to heat and then returns to its original condition when cooled to room temperature.

As shown in FIG. 1, package film 10 comprises first foil layer 12 and second foil layer 14. First foil layer 12 is positioned exterior second foil layer 14, and second foil layer 14 is positioned interior first foil layer 12. As used throughout this application, the term "interior" refers to a relative position closer to the innermost surface of a film, sheet, web, package or other article. The term "exterior" refers to a relative position closer to the outermost surface of a film, sheet, web, package or other article. Accordingly, the term "interior layer" refers to a layer comprising the innermost surface of a film, sheet, web, package or other article. The term "exterior layer" refers to a layer comprising the outermost surface of a film, sheet, web, package or other article. Additionally, the exterior layer and the interior layer each have an inner surface and an outer surface. The term "inner surface" refers to a surface touching another layer, and the term "outer surface" refers to a surface not touching another layer. As shown in FIG. 1, first foil layer 12 is the exterior layer of package film 10. However, in other embodiments of the present application, first foil layer 12 may not be the exterior layer. In such embodiments, for example, the outer surface of first foil layer 12 may be partially or fully coated with primer, indicia, or other coating; the outer surface of first foil layer 12 may be corona or otherwise treated to facilitate adherence of the primer, indicia, or other coating.

First foil layer 12 and second foil layer 14 comprise foil. As used throughout this application, the term "foil" refers to alloys of metal foils. Such metal foils include but are not limited to aluminum foils. Non-limiting examples of aluminum foil alloys include 1100, 1235, 3003, 8011, 8021, and 8079. Specific non-limiting examples of foil, in general, include 1.3 mil (130 gauge) aluminum foil of alloy 8079 and 0.50 mil (50 gauge) aluminum foil alloy of 8079 (bright one side, matte one side) (each available from JW Aluminum (Goose Creek, South Carolina)), 0.25 mil (25 gauge) aluminum foil of alloy 8079 (available from Noble Americas Corporation (Stamford, Connecticut)), and 0.25 mil (25 gauge (6.3 micron)) aluminum foil of alloy 8079 (available from Norsk Hydro ASA (Oslo, Norway)). In the present application, first foil layer 12 and second foil layer 14 each has a thickness of 0.5 mil or less (but greater than 0 mil), mil or less (but greater than 0 mil), 0.25 mil or less (but greater than 0 mil), or of from 0.25 mil to 0.5 mil. As a result, the package films described in the present application are "reduced foil" package films as compared to heavy gauge films comprising 1.3 mil or 1.5 mil or greater foil. First foil layer 12 and second foil layer 14 may have the same or different thickness. For example, first foil layer 12 may have a thickness of 0.5 mil and second foil layer 14 may have a thickness of 0.25 mil.

Package film 10 further comprises multilayer structure 15 positioned between (or intervening) first foil layer 12 and second foil layer 14. As such first foil layer 12 and second foil layer 14 are "split" or "separated" foil layers, in that they do not share a common surface or boundary. Multilayer structure 15 has a thickness of from 0.75 mil to 2 mil, or 0.9 mil to 1.5 mil, or from 0.9 mil to 1.3 mil. It is believed, without being bound by belief, that a thickness of 0.75 mil to 2 mil is optimal for both package film strength (e.g., stiffness, tear, puncture, etc.) and reduced curl. Multilayer structure 15 comprises at least a high modulus layer and a bulk layer (as depicted but not numbered). In some embodiments (described further below) the high modulus layer may be positioned exterior the bulk layer; in other embodiments (described further below), the bulk layer may be positioned exterior the high modulus layer.

As used throughout this application, the term "high modulus layer" refers to a layer having a secant modulus in each of the machine direction and the transverse direction of greater than 120,000 psi or having an elongation at break in each of the machine direction and the transverse direction of less than 150%. As used throughout this application, the term "secant modulus" refers to an approximation of the elastic modulus or Young's modulus of a film and is the slope of a line from the origin of a curve (zero strain) to a specific strain point of the stress-strain curve. ASTM D882, "Standard Test Method for Tensile Properties of Thin Plastic Sheeting" sets forth procedures for measuring secant modulus of film. In some embodiments, secant modulus may be measured at 1% strain and 2% strain. As used throughout this application, the term "elongation at break" refers to the extension (i.e., lengthening or stretching) produced by a tensile stress at the moment of rupture of a film. Elongation at break is often expressed as a percentage of the original length of the specimen. ASTM D882, "Standard Test Method for Tensile Properties of Thin Plastic Sheeting" sets forth procedures for measuring elongation at break of film. As used throughout this application, the term "machine direction" or "MD" refers to the direction of film transport during or after extrusion or film conversion. As used throughout this application, the term "transverse direction" or "TD" refers to the direction perpendicular to the machine direction. The high modulus layer has a higher stiffness and higher modulus (i.e., lower elasticity) than the bulk layer. The high modulus layer may have a thickness of from 0.35 mil to 1 mil. The high modulus layer may be an oriented film, a blown film, or otherwise as known in the packaging arts. Non-limiting examples of oriented film include biaxially oriented nylon film, biaxially oriented polyethylene terephthalate film, and biaxially oriented polypropylene film. In various embodiments, one surface or both surfaces or neither surface of the high modulus layer may be chemically treated, corona treated or otherwise treated.

As used throughout this application, the term "biaxially oriented nylon film" or "biaxially oriented polyamide film" or "BON film" or "OPA film" or "BOPA film" refers to a thermoplastic web comprising biaxially oriented nylon. A non-limiting example of biaxially oriented nylon film is Capran® 1200 (available from Honeywell Performance Materials and Technologies (Morristown, New Jersey)), a 0.47 mil (12 micron) film having a reported secant modulus in the machine direction of 300,000-400,000 psi, a reported secant modulus in the transverse direction of 300,000-400,000 psi, a reported elongation at break in the machine direction of 60-90%, and a reported elongation at break in the transverse direction of 60-90%. A still further non-limiting example of biaxially oriented nylon film is Biaxis (BOPA) 15 (available from Sojitz Plastics America Inc. (Schaumburg, Illinois)), a 0.6 mil film having a reported elongation at break in the machine direction of 90-150% and a reported elongation at break in the transverse direction of %.

As used throughout this application, the term "biaxially oriented polyethylene terephthalate film" or "biaxially oriented polyester" or "OPET film" or "BOPET film" refers to a thermoplastic web comprising biaxially oriented polyethylene terephthalate. A non-limiting example of biaxially oriented polyethylene terephthalate film is Skyrol® SP93C (48 ga) (available from SKC, Inc. (Covington, Georgia)), a 0.48 mil film having a reported elongation at break in the machine direction of 115% and a reported elongation at break in the transverse direction of 120%. Further non-limiting examples of biaxially oriented polyethylene terephthalate film are Flexpet™ F-PAP-12 (available from FlexFilms (USA) Inc. (Elizabethtown, Kentucky), a 0.48 mil film having a reported elongation at break in the machine direction of 105% and a reported elongation at break in the transverse direction of 85%; and Flexpet™ F-AUT-10, (also available from FlexFilms (USA) Inc. (Elizabethtown, Kentucky), a 0.4 mil film having a reported elongation at break in machine direction of 100% and a reported elongation at break in the transverse direction of 80%.

As used throughout this application, the term "biaxially oriented polypropylene film" or "OPP film" or "BOPP film" refers to a thermoplastic web comprising biaxially oriented polypropylene. A general, non-limiting example of biaxially oriented polypropylene film is Oppalyte™ 30 HM (available from Jindal Films Americas (LaGrange, Georgia), a 1.3 mil white opaque OPP film with a cavitated core. A further non-limiting example of biaxially oriented polypropylene film is Oppalyte™ 20MD347 (available from Jindal Films Americas (LaGrange, Georgia)), a 0.8 mil white opaque OPP film with a cavitated core, having a reported secant modulus in the machine direction of 218,000 psi, a reported secant modulus in the transverse direction of 392,000 psi, a reported elongation at break in the machine direction of 160%, and a reported elongation at break in the transverse direction of 30%.

As used throughout this application, the term "bulk layer" refers to a layer adding thickness to a film. The bulk layer has lower stiffness and lower modulus (i.e., higher elasticity) than the high modulus layer. The bulk layer may have a thickness of from 0.4 mil to 1 mil or from 0.5 mil to 1 mil. The bulk layer may be monolayer or multilayer. The bulk layer comprises one or more layers of polyethylene, polypropylene, ionomer, or blends of such.

As used throughout this application, the term "polyethylene" or "PE" refers (unless indicated otherwise) to ethylene homopolymers or copolymers. Such copolymers of ethylene include copolymers of ethylene with at least one alpha-olefin and copolymers of ethylene with other units or groups such as vinyl acetate, acid groups, acrylate groups, or otherwise. The term "polyethylene" or "PE" is used without regard to the presence or absence of substituent branch groups. PE includes, for example, medium density polyethylene, high density polyethylene, low density polyethylene, ethylene alpha-olefin copolymer, ethylene vinyl acetate, ethylene acid copolymers, ethylene acrylate copolymers, or blends of such. Various PE's may be recycled as reclaimed PE.

As used throughout this application, the term "high density polyethylene" or "HDPE" refers to both (a) homopolymers of ethylene which have densities from 0.960 g/cm$^3$ to 0.970 g/cm$^3$ and (b) copolymers of ethylene and an alpha-olefin (usually 1-butene or 1-hexene) which have densities from 0.940 g/cm$^3$ to 0.958 g/cm$^3$. HDPE includes polymers made with Ziegler or Phillips type catalysts and polymers made with single-site metallocene catalysts. HDPE also includes high molecular weight "polyethylenes."

As used throughout this application, the term "low density polyethylene" or "LDPE" refers to branched homopolymers having densities from 0.915 g/cm$^3$ to 0.930 g/cm$^3$, as well as copolymers containing polar groups resulting from copolymerization (such as with vinyl acetate or ethyl acrylate). LDPE typically contains long branches off the main chain (often termed "backbone") with alkyl substituents of two to eight carbon atoms. Specific non-limiting examples of LDPE are EC474AA and EC478AA (each available from Westlake Chemical Corporation (Houston, Texas)), Petrothene® NA204000 (available from LyondellBasell Industries (Houston, Texas)), and MarFlex® 1017 (available from Chevron Phillips Chemical Company LP (The Woodlands, Texas)).

As used throughout this application, the terms "copolymer of ethylene and at least one alpha-olefin" or "ethylene alpha-olefin copolymer" refer to a modified or unmodified copolymer produced by the co-polymerization of ethylene and any one or more alpha-olefins. Suitable alpha-olefins include, for example, $C_3$ to $C_{20}$ alpha-olefins such as 1-propene, 1-butene, 1-pentene, 1-hexene, 1-octene, 1-decene and blends of such. The co-polymerization of ethylene and an alpha-olefin may be produced by heterogeneous catalysis, such as co-polymerization reactions with Ziegler-Natta catalysis systems, including, for example, metal halides activated by an organometallic catalyst (e.g., titanium chloride) and optionally containing magnesium chloride complexed to trialkyl aluminum. Alternatively, the co-polymerization of ethylene and an alpha-olefin may be produced by homogeneous catalysis, such as co-polymerization reactions with metallocene catalysis systems which include constrained geometry catalysts, (e.g., monocyclopentadienyl transition-metal complexes). Homogeneous catalyzed copolymers of ethylene and alpha-olefin may include modified or unmodified ethylene alpha-olefin copolymers having a long-chain branched (i.e., 8-20 pendant carbons atoms) alpha-olefin co-monomer (commercially available as, for example, Affinity™ from The Dow Chemical Company (Midland, Michigan)), linear copolymers (commercially available as, for example, Tafmer™ from the Mitsui Petrochemical Corporation (Tokyo, Japan)), and modified or unmodified ethylene alpha-olefin copolymers having a short-chain branched (i.e., 3-6 pendant carbons atoms) alpha-olefin co-monomer (commercially available as, for example, Exact™ from ExxonMobil Chemical Company (Houston, Texas)). Ethylene alpha-olefin copolymers may include, for example, linear low density polyethylene (LLDPE), metallocene-catalyzed LLDPE (mLLDPE), very low density polyethylene (VLDPE), metallocene-catalyzed VLDPE (mVLDPE), and ultra low density polyethylene (ULDPE). Specific non-limiting examples of LLDPE are ExxonMobil™ LLDPE LL 6202.19 (available from ExxonMobil Corporation (Houston, Texas)); and SCLAIR® FP619-A and SCLAIR® 31G (each available Nova Chemicals Corporation (Calgary, Alberta, Canada)).

As used throughout this application, the term "ethylene vinyl acetate" or "EVA" refers to copolymers comprised of repeating units of ethylene and vinyl acetate. Ethylene vinyl acetate copolymers may be represented by the general formula: $[(CH_2-CH_2)_n-(CH_2-CH(COO)(CH_3)]_n$. The vinyl acetate content may vary from less than 10% to greater than 95% by weight (of total EVA composition). The vinyl acetate content of EVA for packaging applications may vary from % to 40% by weight. A specific non-limiting example of EVA is Escorene™ Ultra LD 705.MJ, having a reported vinyl acetate content of 12.8% by weight (available from ExxonMobil Corporation (Houston, Texas)).

As used throughout this application, the term "ethylene acid copolymers" refers to copolymers comprised of repeating units of ethylene and acid groups. The acid group content may vary from 2% to 25% by weight. Non-limiting examples of ethylene acid copolymers include ethylene methacrylic acid (EMAA) and ethylene acrylic acid (EAA). Specific non-limiting examples of EAA are Nucrel® 3990, having a reported acrylic acid content of 9.5% by weight (available from E.I. du Pont de Nemours and Company, Inc. (Wilmington, Delaware)) and Primacor® 3440, having a reported acrylic acid content of 9.7% by weight (available from The Dow Chemical Company (Midland, Michigan)).

As used throughout this application, the term "ethylene acrylate copolymers" refers to copolymers comprised of repeating units of ethylene and acrylate groups. The acrylate group may be butyl-, ethyl-, methyl-, or otherwise. Non-limiting examples of ethylene acrylate copolymers include ethylene methyl acrylate (EMA) and ethylene methyl methacrylate (EMMA). A specific non-limiting example of EMA is DuPont™ Appeel® 20D828 (available from E.I. du Pont de Nemours and Company, Inc. (Wilmington, Delaware)).

As used throughout this application, the term "polypropylene" or "PP" refers to a plastomer, homopolymer or copolymer having at least one propylene monomer linkage within the repeating backbone of the polymer. The propylene linkage may be represented by the general formula: $[CH_2-CH(CH_3)]_n$. Such polypropylene may be a polypropylene impact copolymer, a polypropylene random copolymer, or a polypropylene homopolymer, may be syndiotactic or isotactic, or may or may not be clarified. A specific non-limiting example of polypropylene is P9H8M-015 (available from Flint Hills Resources (Longview, Texas)).

As used throughout this application, the term "ionomer" refers to ionic copolymers formed from an olefin and an ethylenically unsaturated monocarboxylic acid having the carboxylic acid moieties partially or completely neutralized by a metal ion. Suitable metal ions may include, but are not limited to, sodium, potassium, lithium cesium, nickel, and zinc. Suitable carboxylic acid comonomers may include, but are not limited to, ethylene acid copolymers, such as, ethylene methacrylic acid, methylene succinic acid, maleic anhydride, vinyl acetate methacrylic acid, methyl methacrylate methacrylic acid, styrene methacrylic acid, and blends of such. Useful ionomer ethylene/acid copolymer resins may include an olefinic content of at least 50 mole percent based upon the copolymer and a carboxylic acid content of from 5 to 25 mole percent based upon the copolymer.

As used throughout this application, the term "copolymer" refers to a polymer product obtained by the polymerization reaction or copolymerization of at least two monomer species. Copolymers may also be referred to as bipolymers. The term "copolymer" is also inclusive of the polymerization reaction of three, four or more monomer species having reaction products referred to terpolymers, quaterpolymers, etc.

As used throughout this application, the term "modified" refers to a chemical derivative, such as one having any form of anhydride functionality (e.g., anhydride of maleic acid, crotonic acid, citraconic acid, itaconic acid, fumaric acid, etc.), whether grafted onto a polymer, copolymerized with a polymer or blended with one or more polymers. The term is also inclusive of derivatives of such functionalities, such as acids, esters and metal salts derived from such.

Referring again to FIG. 1, package film 10 also comprises sealant film 20. As used throughout this application, the term "sealant film" refers to a film included in a package film and involved in the sealing of the package film to itself or to another layer of another film, sheet, etc. The term "sealant layer" or "sealant layers" refers to the specific layer or layers of the sealant film involved in the sealing to itself or to another layer. A sealant film may be monolayer or multilayer. If the sealant film is monolayer, the term "sealant film" is synonymous with the term "sealant layer." In the present application, sealant film 20 may be monolayer or multilayer and may be a blown film sealant, an extrusion coated sealant, or a heat seal lacquer. In some embodiments, sealant film 20 is a blown film sealant or an extrusion coated sealant having a thickness of at least 0.5 mil, or of at least 0.75 mil, or of from 0.5 mil to 3 mil, or of from 0.75 mil to 1.5 mil. At such thickness, sealant film 20 is a high performance sealant, facilitating sealing performance.

As shown in FIG. 1, sealant film 20 is positioned adjacent and interior second foil layer 14. As used throughout this application, the term "adjacent" refers to being near, close, contiguous, adjoining or neighboring in proximity. It includes but is not limited to being reasonably close to or in the vicinity of as well as touching, having a common boundary or having direct contact. As such, sealant film 20 is also positioned adjacent multilayer structure 15. As shown in FIG. 1, sealant film 20 is the interior layer of package film 10. However, in other embodiments of the present application, sealant film 20 may not be the interior layer. In such embodiments, for example, the outer surface of sealant film 20 may be partially or fully coated with primer, indicia, or other coating; the outer surface of sealant film 20 may be corona or otherwise treated to facilitate adherence of the primer, indicia, or other coating.

Figure 2:
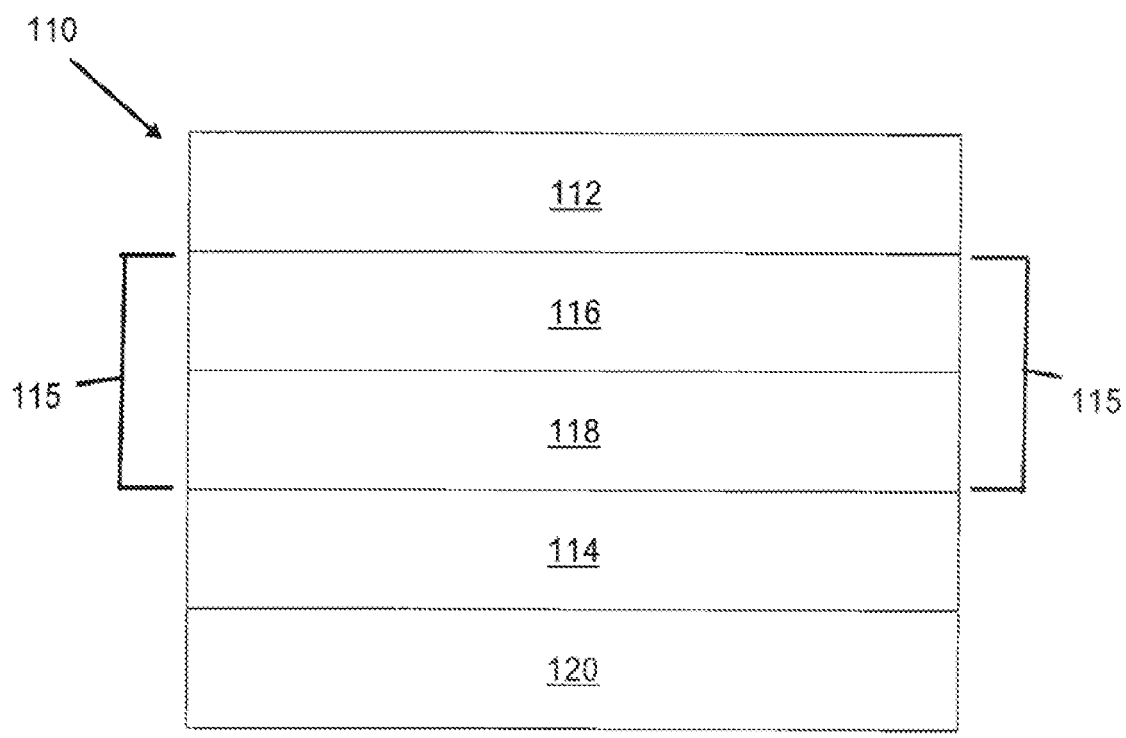
FIG. 2 is a schematic cross-sectional view of a second embodiment of a package film according to the present application.

FIG. 2 is a schematic cross-sectional view of a second embodiment of a package film according to the present application. Package film 110 comprises first foil layer 112 and second foil layer 114. First foil layer 112 is positioned exterior second foil layer 114, and second foil layer 114 is positioned interior first foil layer 112. First foil layer 112 and second foil layer 114 may be the same as or similar to first foil layer 12 and second foil layer 14 as described above. Package film 110 further comprises multilayer structure 115 positioned between first foil layer 112 and second foil layer 114. As such first foil layer 112 and second foil layer 114 are "split" or "separated" foil layers, in that they do not share a common surface or boundary. Multilayer structure 115 may be the same as or similar to multilayer structure 15 as described above. Multilayer structure 115 comprises high modulus layer 116 and bulk layer 118. High modulus layer 116 and bulk layer 118 may be the same as or similar to that described above. As shown in FIG. 2, high modulus layer 116 is positioned exterior bulk layer 118 and bulk layer 118 is positioned interior high modulus layer 116. Package film 110 also comprises sealant film 120. Sealant film 120 may be the same as or similar to sealant film 20 as described above. Sealant film 120 is positioned interior second foil layer 114.

Figure 3:
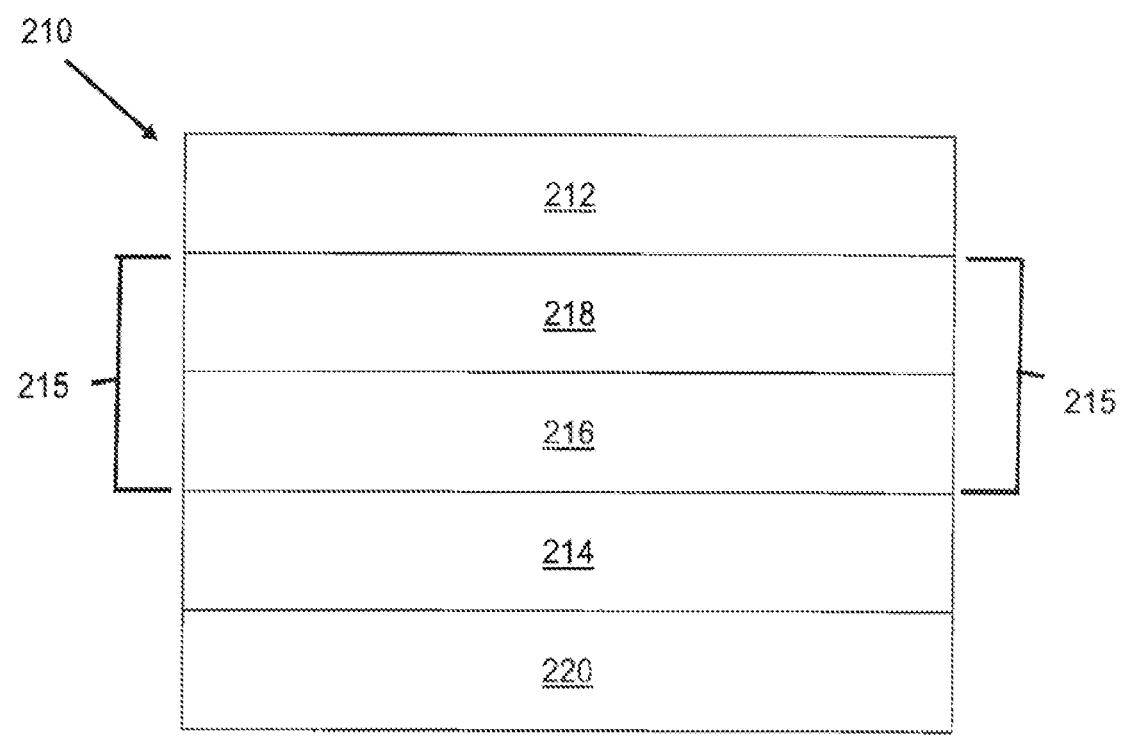
FIG. 3 is a schematic cross-sectional view of a third embodiment of a package film according to the present application.

FIG. 3 is a schematic cross-sectional view of a third embodiment of a package film according to the present application. Package film 210 comprises first foil layer 212 and second foil layer 214. First foil layer 212 is positioned exterior second foil layer 214, and second foil layer 214 is positioned interior first foil layer 212. First foil layer 212 and second foil layer 214 may be the same as or similar to first foil layer 12 and second foil layer 14 as described above. Package film 210 further comprises multilayer structure 215 positioned between first foil layer 212 and second foil layer 214. As such first foil layer 212 and second foil layer 214 are "split" or "separated" foil layers, in that they do not share a common surface or boundary. Multilayer structure 215 may be the same as or similar to multilayer structure 15 as described above. Multilayer structure 215 comprises high modulus layer 216 and bulk layer 218. High modulus layer 216 and bulk layer 218 may be the same as or similar to that described above. As shown in FIG. 3, bulk layer 218 is positioned exterior high modulus layer 216 and high modulus layer 216 is positioned interior bulk layer 218. Package film 210 also comprises sealant film 220. Sealant film 220 may be the same as or similar to sealant film 20 as described above. Sealant film 220 is positioned interior second foil layer 214.

Figure 4:
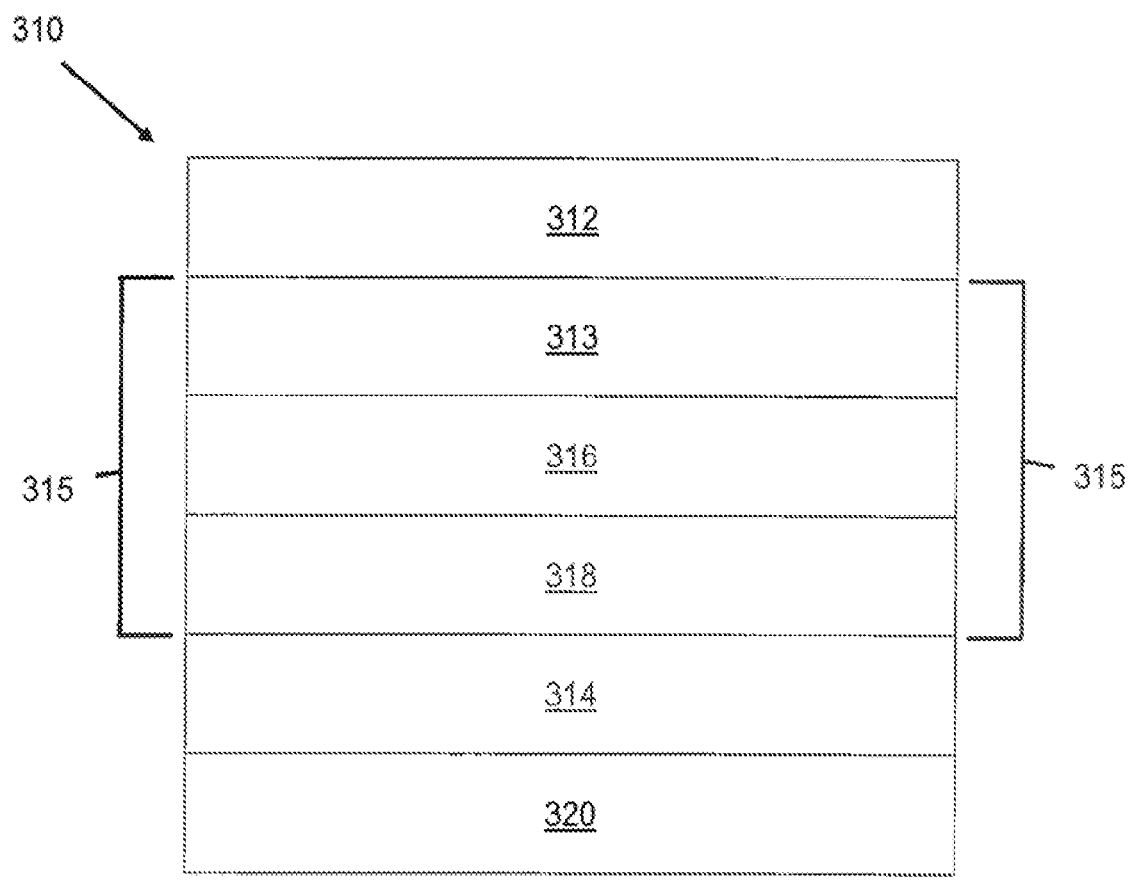
FIG. 4 is a schematic cross-sectional view of a fourth embodiment of a package film according to the present application.

FIG. 4 is a schematic cross-sectional view of a fourth embodiment of a package film according to the present application. Package film 310 comprises first foil layer 312 and second foil layer 314. First foil layer 312 is positioned exterior second foil layer 314, and second foil layer 314 is positioned interior first foil layer 312. First foil layer 312 and second foil layer 314 may be the same as or similar to first foil layer 12 and second foil layer 14 as described above. Package film 310 further comprises multilayer structure 315 positioned between first foil layer 312 and second foil layer 314. As such first foil layer 312 and second foil layer 314 are "split" or "separated" foil layers, in that they do not share a common surface or boundary. Multilayer structure 315 may be the same as or similar to multilayer structure 15 as described above. Multilayer structure 315 comprises high modulus layer 316 and bulk layer 318. High modulus layer 316 and bulk layer 318 may be the same as or similar to that described above. As shown in FIG. 4, high modulus layer 316 is positioned exterior bulk layer 318 and bulk layer 318 is positioned interior high modulus layer 316.

As further shown in FIG. 4, multilayer structure 315 further comprises adhesive layer 313. Adhesive layer 313 is positioned between first foil layer 312 and high modulus layer 316 and adheres first foil layer 312 to high modulus layer 316. As used throughout this application, the term "adhesive" or "adh" refers to materials adhering two surfaces to one another, such as the planar surfaces of two film layers. Unless otherwise specifically indicated, an adhesive may have any suitable composition that provides a desired level of adhesion with the one or more surfaces in contact with the adhesive. Adhesives may be solvent-based, water-based (also known as waterborne), or solventless. Solvent-based adhesives include an adhesive and at least one solvent and require the solvent to be removed by evaporation (e.g., drying) after the solvent-based adhesive is applied. Non-limiting examples of solvent-based adhesives include two-part polyurethane adhesives, including but not limited to those with solids content greater than 30% by weight. A specific non-limiting example of a solvent based adhesive is a two-part adhesive comprising Liofol® LA PB5210 (a solvent urethane adhesive) and Liofol® LA PB 500-83 (a solvent urethane co-reactant), having a solids content of 40% by weight (available individually and in combination from Henkel Corporation (Rocky Hill, Connecticut)). A further specific non-limiting example of a solvent-based adhesive is a two-part adhesive comprising LAMAL™ HSA (adhesive) and LAMAL™ C (co-reactant), having a solids content of 32% by weight (available individually and in combination from The Dow Chemical Company (Midland, Michigan)). Another further specific non-limiting example of a solvent-based adhesive is a two-part adhesive comprising ADCOTE™ 536A (adhesive) and ADCOTE™ 536B (co-reactant), having a solids content of 40% by weight (available individually and in combination from The Dow Chemical Company (Midland, Michigan)). Another further specific non-limiting example of a solvent-based adhesive is a two-part adhesive comprising ADCOTE™ 545E (adhesive) and ADCOTE Coreactant CT (co-reactant), having a solids content of 32% by weight (available from The Dow Chemical Company (Midland, Michigan)). Such adhesives generally have negligible effect on the thickness of the film.

Referring to FIG. 4, package film 310 also comprises sealant film 320. Sealant film 320 may be the same as or similar to sealant film 20 as described above and, in the embodiment of FIG. 4, may specifically be an extrusion coated sealant. Sealant film 320 is positioned interior second foil layer 314.

Figure 5:
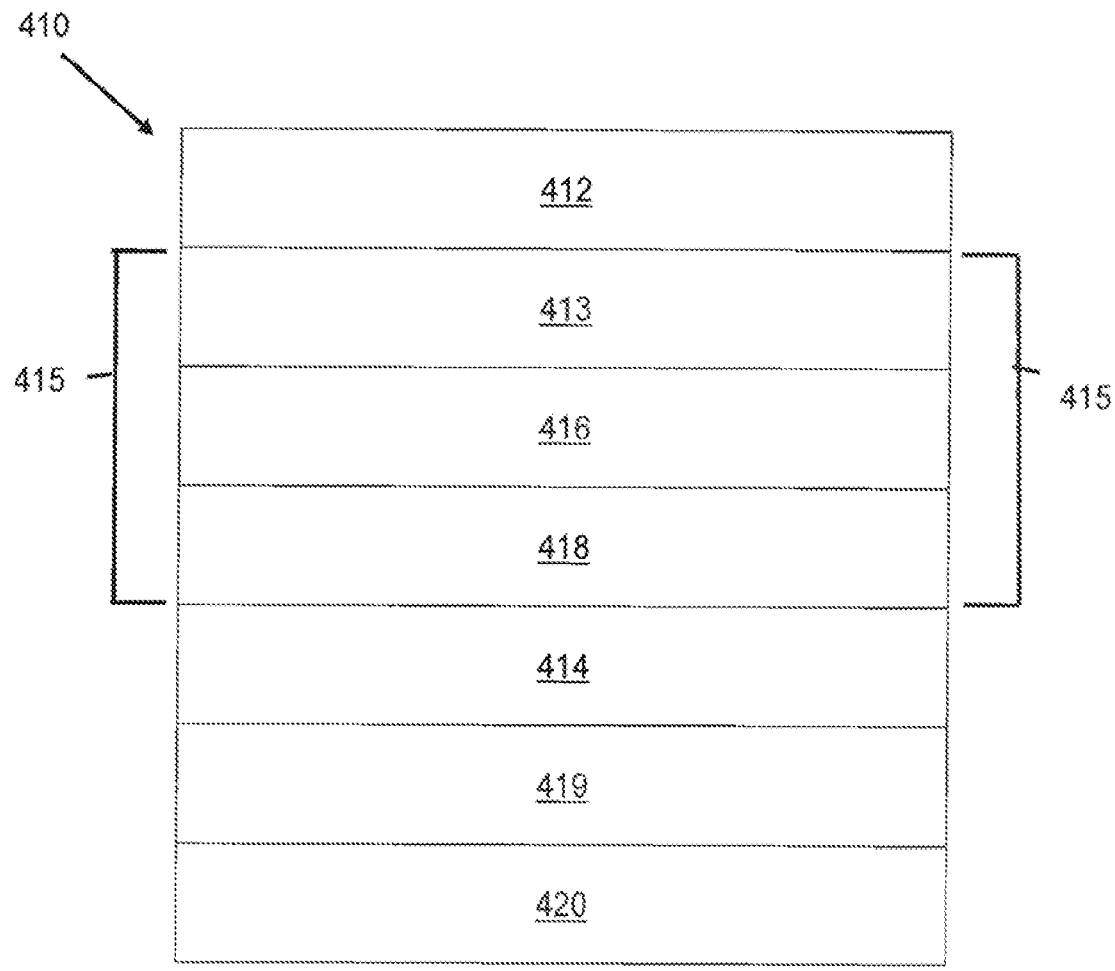
FIG. 5 is a schematic cross-sectional view of a fifth embodiment of a package film according to the present application.

FIG. 5 is a schematic cross-sectional view of a fifth embodiment of a package film according to the present application. Package film 410 comprises first foil layer 412 and second foil layer 414. First foil layer 412 is positioned exterior second foil layer 414, and second foil layer 414 is positioned interior first foil layer 412. First foil layer 412 and second foil layer 414 may be the same as or similar to first foil layer 12 and second foil layer 14 as described above. Package film 410 further comprises multilayer structure 415 positioned between first foil layer 412 and second foil layer 414. As such first foil layer 412 and second foil layer 414 are "split" or "separated" foil layers, in that they do not share a common surface or boundary. Multilayer structure 415 may be the same as or similar to multilayer structure 15 as described above. Multilayer structure 415 comprises high modulus layer 416 and first bulk layer 418. High modulus layer 416 and first bulk layer 418 may be the same as or similar to that described above. As shown in FIG. 5, high modulus layer 416 is positioned exterior first bulk layer 418 and first bulk layer 418 is positioned interior high modulus layer 416. As further shown in FIG. 5, multilayer structure 415 further comprises adhesive layer 413. Adhesive layer 413 may be the same as or similar to adhesive layer 313 described above. Adhesive layer 413 is positioned between first foil layer 412 and high modulus layer 416 and adheres first foil layer 412 to high modulus layer 416.

Package film 410 also comprises sealant film 420. Sealant film 420 may be the same as or similar to sealant film 20 as described above. Sealant film 420 is positioned interior second foil layer 414. Package film package film 410 further comprises second bulk layer 419. Second bulk layer 419 may be the same as or similar to first bulk layer 418 as described above. Second bulk layer 419 is positioned between second foil layer 414 and sealant film 420 and adheres second foil layer 414 to sealant film 420. In the embodiment of FIG. 5, sealant film 420 may specifically be a blown film sealant.

Figure 6:
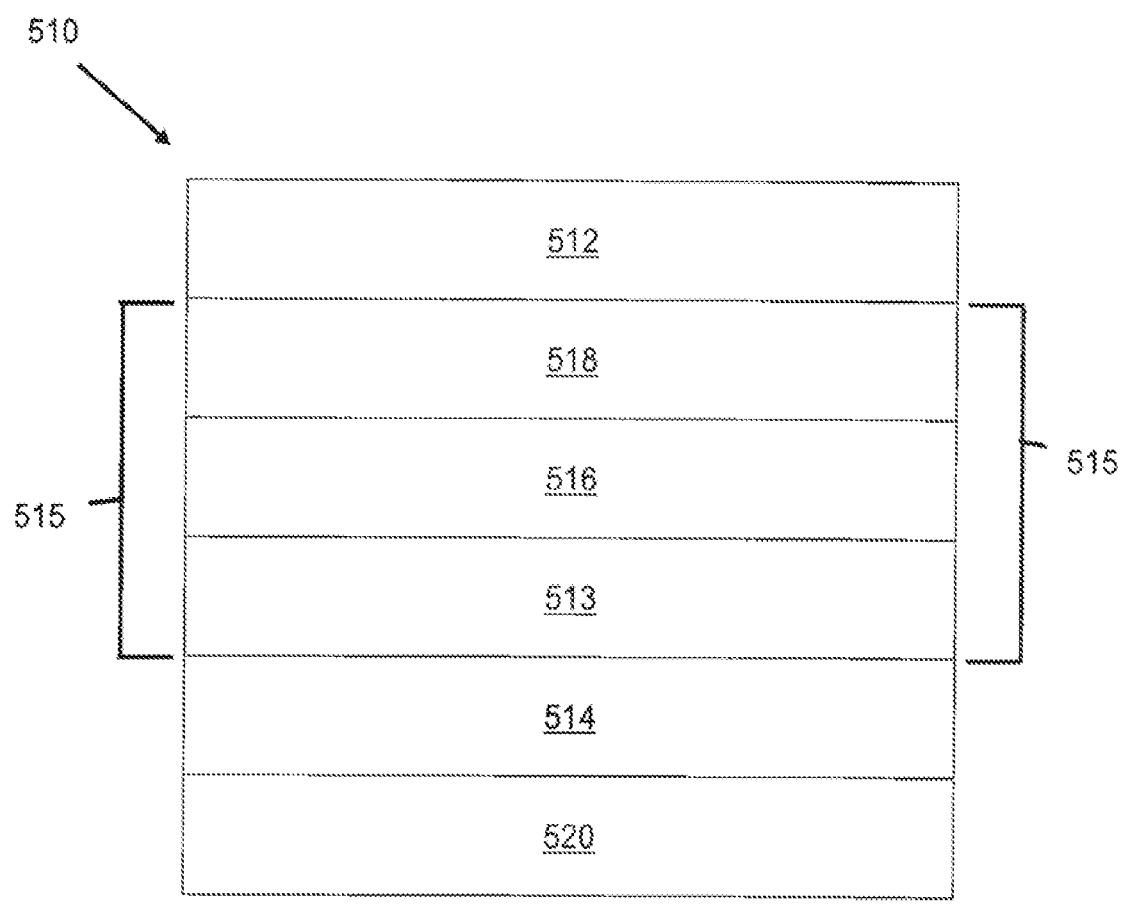
FIG. 6 is a schematic cross-sectional view of a sixth embodiment of a package film according to the present application.

FIG. 6 is a schematic cross-sectional view of a sixth embodiment of a package film according to the present application. Package film 510 comprises first foil layer 512 and second foil layer 514. First foil layer 512 is positioned exterior second foil layer 514, and second foil layer 514 is positioned interior first foil layer 512. First foil layer 512 and second foil layer 514 may be the same as or similar to first foil layer 12 and second foil layer 14 as described above. Package film 510 further comprises multilayer structure 515 positioned between first foil layer 512 and second foil layer 514. As such first foil layer 512 and second foil layer 514 are "split" or "separated" foil layers, in that they do not share a common surface or boundary. Multilayer structure 515 may be the same as or similar to multilayer structure 15 as described above. Multilayer structure 515 comprises high modulus layer 516 and bulk layer 518. High modulus layer 516 and bulk layer 518 may be the same as or similar to that described above. As shown in FIG. 6, bulk layer 518 is positioned exterior high modulus layer 516 and high modulus layer 516 is positioned interior bulk layer 518. As further shown in FIG. 6, multilayer structure 515 further comprises adhesive layer 513. Adhesive layer 513 may be the same as or similar to adhesive layer 313 described above. Adhesive layer 513 is positioned between high modulus layer 516 and second foil layer 514 and adheres high modulus layer 516 to second foil layer 514. Package film 510 also comprises sealant film 520. Sealant film 520 may be the same as or similar to sealant film 20 as described above. Sealant film 520 is positioned interior second foil layer 514. In the embodiment of FIG. 6, sealant film 520 may specifically be an extrusion coated sealant.

Specific non-limiting examples of methods of making the package film described in the present application include the following: A first foil layer is acquired or produced by means known in the art. A high modulus layer is also acquired or produced by means known in the art. The first foil layer is adhesive laminated to the high modulus layer. A second foil layer is acquired or produced by means known in the art and extrusion laminated (by means of a bulk layer) to the high modulus layer. A sealant film is extrusion coated on the second foil layer.

Alternatively, a first foil layer is acquired or produced by means known in the art. A high modulus layer is also acquired or produced by means known in the art. The first foil layer is adhesive laminated to the high modulus layer. A second foil layer is acquired or produced by means known in the art and extrusion laminated (by means of a first bulk layer) to the high modulus layer. A blown sealant film is acquired or produced by means known in the art and extrusion laminated by means of a second bulk layer) to the second foil layer.

The resulting package film may be embossed through unheated, engraved, intermeshing rolls. The embossing rolls create a texture on each surface of the package film and aid in de-nesting of lids that may be die cut from the resulting embossed package film. The die cut lids may have any shape known in the art, such as circular, elliptical, oval, square, rectangular, diamond, hexagonal, otherwise polygonal, etc.

EXAMPLES

To further exemplify the various embodiments of the present application, several example and comparative example films were produced and evaluated for various properties. TABLE 1 provides information regarding the composition of the various examples and comparative examples.

TABLE 1

|  | Structure |
|---|---|
| Example 1 | 0.25 mil foil/adh/0.48 mil OPET/0.5 mil bulk (processing aid/LDPE/EAA)/ 0.25 mil foil/1.0 mil extrusion coated sealant #1 |
| Example 2 | 0.25 mil foil/adh/0.48 mil OPET/1.0 mil bulk (processing aid/LDPE/EAA)/ 0.25 mil foil/1.0 mil extrusion coated sealant #1 |
| Example 3 | 0.25 mil foil/adh/0.48 mil OPET/0.5 mil bulk (processing aid/LDPE/EAA)/ 0.25 mil foil/1.0 mil extrusion coated sealant #2 |
| Example 4 | 0.25 mil foil/adh/0.48 mil OPET/0.5 mil bulk (processing aid/LDPE/EAA)/ 0.25 mil foil/1.0 mil extrusion coated sealant #3 |
| Example 5 | 0.25 mil foil/adh/0.48 mil BON/0.5 mil bulk (processing aid/LDPE/EAA)/ 0.25 mil foil/1.0 mil extrusion coated sealant #2 |
| Example 6 | 0.25 mil foil/adh/0.48 mil OPET/0.5 mil bulk (processing aid/LDPE/EAA)/ 0.25 mil foil/0.5 mil bulk (EAA/LDPE/LDPE)/1.0 mil blown sealant #1 |
| Example 7 | 0.25 mil foil/adh/0.48 mil OPET/0.5 mil bulk (processing aid/LDPE/EAA)/ 0.25 mil foil/0.5 mil bulk (EAA/LDPE/LDPE)/1.0 mil blown sealant #2 |
| Example 8 | 0.25 mil foil/0.5 mil bulk (EAA/LDPE/LDPE)/0.48 mil OPET/adh/0.25 mil foil/1.0 mil extrusion coated sealant #1 |
| Example 9 | 0.25 mil foil/adh/0.40 mil OPET/0.9 mil bulk (processing aid/LDPE/LLDPE/ EAA)/0.25 mil foil/0.8 mil extrusion coated sealant #4 |
| Comparative Example 1 | processing aid/1.3 mil foil/1.3 mil extrusion coated sealant #5 |
| Comparative Example 2 | 1.5 mil foil/1.4 mil extrusion coated sealant #6 |
| Comparative Example 3 | 0.25 mil foil/adh/1.3 mil OPP/adh/0.25 mil foil/adh/1.0 mil blown sealant #3 |
| Comparative Example 4 | 0.48 mil OPET/adh/0.25 mil foil/0.5 mil bulk (processing aid/LDPE/EAA)/ 0.25 mil foil/1.0 mil extrusion coated sealant #1 |
| Comparative Example 5 | 0.25 mil foil/1.0 mil bulk (EAA)/0.25 mil foil/0.5 mil bulk (EAA/LDPE)/1.0 mil blown sealant #4 |
| Comparative Example 6 | 0.25 mil foil/1.0 mil bulk (EAA)/0.25 mil foil/0.5 mil bulk (EAA/LDPE)/1.0 mil blown sealant #5 |
| Comparative Example 7 | 0.25 mil foil/1.0 mil bulk (EAA/LLDPE/LDPE/EAA)/0.25 mil foil/0.5 mil bulk (EAA/LLDPE/LDPE)/1.0 mil blown sealant #6 |

(As used throughout this application, the term "processing aids" refers to anti-block agents, slip agents, stabilizing agents, release agents, lubricating agents, anti-oxidants, photo-initiators, primers, colorants, and other additives known to and used by a person of ordinary skill in the art without undue experimentation. Such processing aids have negligible effect on the thickness of the film. The use of processing aids varies depending on the equipment, materials, desired aesthetics, etc.)

Figure 7:
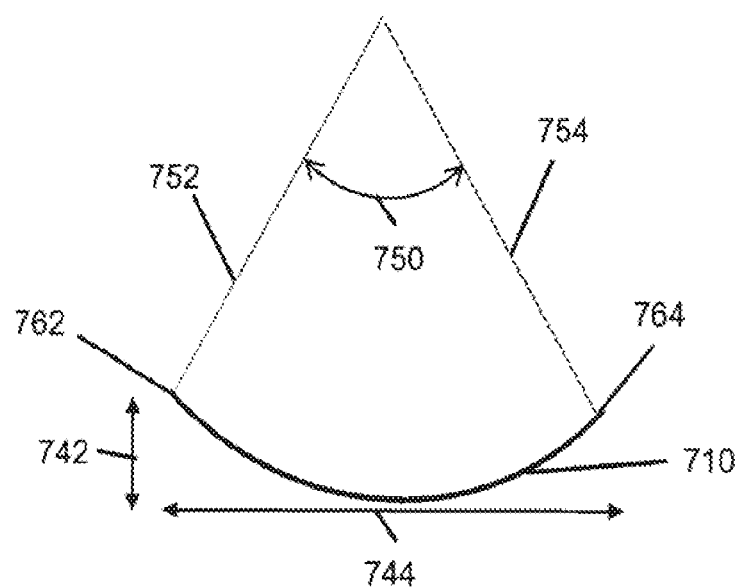
FIG. 7 is a diagram illustrating the key dimensions for determining curl.

Lids were then die cut from unembossed and embossed films of the various examples and comparative examples. The die cut lids were evaluated for curl. FIG. 7 is a diagram illustrating the key dimensions for determining curl. The curl of a die cut lid was measured by cutting a strip measuring 10 mm by 50 mm in the machine direction from the center of the die cut lid. The strip was cut in such a manner to avoid deforming the lid material. Height 742 and width 744 of sample 710 were measured in mm. Central angle 750 was formed by first radius 752 extending from first end 762 of sample 710 and second radius 754 extending from second end 764 of sample 710. The measured height 742 and width 744 were used to calculate the first radius 752 and the second radius 754 (equivalent radius "R") by the following Equation 1.

$$R = \frac{H}{2} + \frac{W^2}{8H}$$

Central angle 750 was then calculated by the following Equation 2. ("L" was the arc length, i.e., the 50 mm length of the cut strip.)

$$D = \frac{180 L}{\pi R}$$

For example, strips cut from the die cut lid of the film of Example 3 had height 742 of 3 mm and width 744 of 50 mm. Using Equation 1, first radius 752 and second radius 754 were each calculated to be 106 mm. Using Equation 2, central angle 750 was calculated to be 27°. In general, a higher central angle indicates more curl.

TABLE 2 provides the measured initial thickness (i.e., of the unembossed die cut lid), the measured embossed thickness (i.e., from the perceived "highest peak" to the perceived "lowest valley" of the embossed die cut lid), the percent change in thickness, the calculated initial curl (i.e., of the unembossed die cut lid), the calculated embossed curl (i.e., of the embossed die cut lid), the direction of curl, and the percent change in curl. Positive curl values indicate curl toward the first foil layer (i.e., the foil layer positioned exterior the multilayer structure comprising the high modulus layer and the bulk layer); negative curl values indicate curl toward the sealant film.

TABLE 2

|  | Initial Thickness (measured) (mil) | Embossed Thickness (measured) (mil) | Thickness Change | Initia Curl (deg) | Embossed Curl (deg) | Curl Direction | Curl Change |
| --- | --- | --- | --- | --- | --- | --- | --- |
| Example 1 | 2.5 | 3.7 | 48% | −18 | 18 | to sealant, then to foil | 200% |
| Example 2 | 3 | 4.8 | 60% | −9 | 18 | to sealant, then to foil | 300% |
| Example 3 | 2.5 | 5 | 100% | 27 | 27 | to foil | 0% |
| Example 4 | 2.7 | 5.5 | 104% | 27 | 27 | to foil | 0% |
| Example 5 | 2.5 | 5 | 100% | 27 | 27 | to foil | 0% |
| Example 6 | 3.4 | 4.9 | 44% | −27 | −27 | to sealant | 0% |
| Example 7 | 3.3 | 4.8 | 45% | −36 | −36 | to sealant | 0% |
| Example 8 | 2.6 | 4.5 | 73% | −9 | −38 | to sealant | −322% |
| Example 9 | 2.5 | 5.5 | 120% | 55 | 55 | to foil | 0% |
| Comparative Example 1 | 2.6 |  |  |  |  |  |  |
| Comparative Example 2 | 3 | 7 | 133% | −18 | −36 | to sealant | −100% |
| Comparative Example 3 | 2.8 | 4.9 | 75% | −18 | −56 | to sealant | −211% |
| Comparative Example 4 | 2.5 | 3.5 | 40% | 55 | 120 | to OPET | −118% |
| Comparative Example 5 | 3.2 | 6 | 88% | −92 | −221 | to sealant | −140% |
| Comparative Example 6 | 3.1 | 6 | 94% | −55 | −159 | to sealant | −189% |
| Comparative Example 7 | 2.8 | 5.4 | 93% | −36 | −170 | to sealant | −372% |

Each of Examples 1-9 (i.e., each film structure with a first foil layer, a second foil layer, a multilayer structure positioned between the first foil layer and the second foil layer and comprising at least a high modulus layer and a bulk layer, and a sealant film positioned interior the second foil layer) had an initial curl and an embossed curl of 40° or less or had a minimal change in curl (e.g., 0% curl change) due to embossing. As such, die cut lids of the package films of Examples 1-9 are expected to be easier to handle during lidding of containers.

In contrast, each of Comparative Examples 3-7 (i.e., those examples with a first foil layer and a second foil layer but not a multilayer structure comprising at least a high modulus layer and a bulk layer positioned between the first foil layer and the second foil layer) had an embossed curl of greater than 40° and had an excessive change in curl (e.g., greater than 100% curl change) due to embossing. As such, die cut lids of the package film of Comparative Examples 3-7 are expected to be difficult to handle during lidding of container.

Of note, package film of Comparative Example 2 includes heavy gauge foil and less economical and environmentally-friendly than the package films of Examples 1-9.

Of further note, the various examples and comparative examples comprised a variety of different sealant films. The various sealant films had no discernible impact on the curl and are believed to contribute minimally (if at all) to curl, as long as such sealant films are "bulky" sealants with a thickness of 0.5 mil or greater.

In addition to minimal curl and economic efficiency, key requirements for die cut lidding applications include sufficient material strength so that the die cut lid is sufficiently stiff for die cutting itself and does not tear upon removal from a container or puncture during transit. As such, various examples and comparative examples were evaluated for loop stiffness, Unnotched Elmendorf Tear, and puncture. TABLE 3 reports the additional properties.

As used throughout this application, the term "loop stiffness" refers to the stiffness of a material as a function of loop stiffness measurement. It is the amount of force required to bend or deflect a sample approximately 0.5 inches at the vertex of a loop and, as such, is reported in grams-force. For the present application, loop stiffness was determined using an Instron® Tensile Testing Unit (available from Instron Corporation (Norwood, Massachusetts)). A 4-inch by 4-inch sample of each material was cut and opposing ends folded toward themselves to form a loop. The folded sample was then placed in a sample holder such that the opposing sides of the sample were separated by a distance of 1.0 inch. A 0.25-inch thick by 5-inch long Song® stainless steel test probe was fitted to the Instron® Tensile Testing Unit, and the unit was configured for stiffness testing, using a 1000-gram-force load cell. The amount of force required to bend or deflect the sample approximately 0.5 inch (1.25 centimeter) at the vertex of the loop was measured and reported. A high loop stiffness generally reflects a stronger material.

As used throughout this application, the term "Unnotched Elmendorf Tear" refers to the force to propagate tearing through an unnotched length of material after the tear has been initiated, using an Elmendorf-type (pendulum) tearing tester. It is an index of a material's tearing resistance. For the present application, Elmendorf Tear was determined in accordance with ASTM D1922-15 ("Standard Test Method for Propagation Tear Resistance of Plastic Film and Thin Sheeting by Pendulum Method"). Elmendorf Tear values are reported as tearing force, such as, in milli-Newtons or gram-force. A high Elmendorf Tear value generally reflects a material that is more difficult to tear.

As used throughout this application, the term "puncture" refers to the slow rate penetration (e.g., one inch per minute) resistance of a material to a driven probe (e.g., a one-eighth-inch-diameter hemispherical probe to first foil layer) at room temperature. For the present application, puncture was determined in accordance with ASTM F1306-16 ("Standard Test Method for Slow Rate Penetration Resistance of Flexible Barrier Films and Laminates"). ASTM F1306-16 provides methods for determining the force, energy, and elongation to perforation. For the present application, puncture is considered the force to perforation, i.e., the peak force to break. As such, puncture values are reported in pound-force.

TABLE 3

| | Loop Stiffness (gram-force) | | Unnotched Elmendorf Tear (gram-force) | | Puncture |
| --- | --- | --- | --- | --- | --- |
| | MD | TD | MD | TD | (pound-force) |
| Example 3 | 76 | 74 | 265 | 348 | 5.2 |
| Example 6 | 124 | 130 | 353 | 393 | 5.7 |
| Comparative Example 1 | 55.7 | 54.4 | 270 | 206 | 3.6 |
| Comparative Example 7 | 72.6 | 77.7 | 308 | 238 | 2.7 |

As shown in TABLE 3, each of Example 3 and Example 6 had sufficient material strength for die cut lidding applications.

Each and every document cited in this present application, including any cross referenced or related patent or application, is incorporated in this present application in its entirety by this reference, unless expressly excluded or otherwise limited. The citation of any document is not an admission that it is prior art with respect to any embodiment disclosed or claimed in this present application or that it alone, or in any combination with any other reference or references, teaches, suggests, or discloses any such embodiment. Further, to the extent that any meaning or definition of a term in this present application conflicts with any meaning or definition of the same term in a document incorporated by reference, the meaning or definition assigned to that term in this present application (including the appended claims) governs.

Unless otherwise indicated, all numbers expressing sizes, amounts, ranges, limits, and physical and other properties used in the present application (including the appended claims) are to be understood as being preceded in all instances by the term "about". Accordingly, unless expressly indicated to the contrary, the numerical parameters set forth in the present application (including the appended claims) are approximations that can vary depending on the desired properties sought to be obtained by a person of ordinary skill in the art without undue experimentation using the teachings disclosed in the present application.

As used in the present application (including the appended claims), the singular forms "a," "an," and "the" encompass embodiments having plural referents, unless the context clearly dictates otherwise. As used in the present application (including the appended claims), the term "or" is generally employed in its sense including "and/or," unless the context clearly dictates otherwise.

Spatially related terms, including but not limited to, "lower," "upper," "beneath," "below," "above," "bottom" and "top," if used in the present application (including the appending claims), are used for ease of description to describe spatial relationships of an element(s) to another. Such spatially related terms encompass different orientations of the device in use or operation, in addition to the particular orientations depicted in the figures and described in the present application (including the appended claims). For example, if an object depicted in the figures is turned over or flipped over, elements previously described as below or beneath other elements would then be above those other elements.

The above description, examples and embodiments disclosed are illustrative only and should not be interpreted as limiting. The present invention includes the description, examples, and embodiments disclosed; but it is not limited to such description, examples, or embodiments. The reader

What is claimed is as follows:

1. A package film comprising
a first foil layer having a thickness of 0.5 mil or less but greater than 0 mil,
a second foil layer having a thickness of 0.5 mil or less but greater than 0 mil,
a multilayer structure positioned between the first foil layer and the second foil layer, wherein the multilayer structure has a thickness of from 0.75 mil to 2 mil and comprises (a) a high modulus layer having a secant modulus in each of the machine direction and the transverse direction of greater than 120,000 psi or having an elongation at break in each of the machine direction and the transverse direction of less than 150% and (b) a multilayer bulk layer comprising a polyethylene layer, the multilayer bulk layer having a lower modulus than the high modulus layer;
an adhesive layer, the adhesive layer directly attached to the high modulus layer and one of the first foil layer or the second foil layer, and
a sealant film, wherein the sealant film is positioned interior the second foil layer.

2. The package film of claim 1, wherein the first foil layer has a thickness of from 0.25 mil to 0.5 mil and the second foil layer has a thickness of from 0.25 mil to 0.5 mil.

3. The package film of claim 1, wherein the high modulus layer has a thickness of from 0.35 mil to 1 mil.

4. The package film of claim 1, wherein the high modulus layer comprises biaxially oriented nylon film, biaxially oriented polyethylene terephthalate film, or biaxially oriented polypropylene film.

5. The package film of claim 1, wherein the multilayer bulk layer has a thickness of from 0.4 mil to 1 mil.

6. The package film of claim 1, wherein the multilayer bulk layer further comprises an ethylene acid copolymer layer.

7. The package film of claim 1, wherein the sealant film comprises a blown film sealant or an extrusion coated sealant and has a thickness of from 0.5 mil to 3 mil.

8. The package film of claim 7, wherein the sealant film has a thickness of from 0.75 mil to 1.5 mil.

9. The package film of claim 1, wherein the high modulus layer is positioned exterior the multilayer bulk layer and the multilayer bulk layer is positioned interior the high modulus layer.

10. The package film of claim 1, wherein the multilayer bulk layer is positioned exterior the high modulus layer and the high modulus layer is positioned interior the multilayer bulk layer.

11. A die cut lid comprising the package film of claim 1.

12. The die cut lid of claim 11, wherein the die cut lid is embossed.

13. A package film comprising:
a first foil layer having a thickness of from 0.25 mil to 0.5 mil,
a second foil layer having a thickness of from 0.25 mil to 0.5 mil,
a multilayer structure positioned between the first foil layer and the second foil layer, wherein the multilayer structure has a thickness of from 0.75 mil to 2 mil and comprises (a) a high modulus layer comprising a biaxially oriented nylon film or a biaxially oriented polyethylene terephthalate film, the high modulus layer having a secant modulus in each of the machine direction and the transverse direction of greater than 120,000 psi or having an elongation at break in each of the machine direction and the transverse direction of less than 150% and (b) a multilayer bulk layer comprising at least: a low density polyethylene layer and an ethylene acid copolymer layer; wherein the high modulus layer is positioned exterior the multilayer bulk layer and the multilayer bulk layer is positioned interior the high modulus layer;
an adhesive layer positioned between the first foil layer and the high modulus layer, wherein the adhesive layer is directly attached to the first foil layer and the high modulus layer; and
an extrusion coated sealant, wherein the extrusion coated sealant is positioned interior the second foil layer.

14. The package film of claim 13, wherein the high modulus layer has a thickness of from 0.35 mil to 1 mil and comprises biaxially oriented polyethylene terephthalate film.

15. The package film of claim 13, wherein the multilayer bulk layer has a thickness of from 0.4 mil to 1 mil.

16. The package film of claim 13, wherein the extrusion coated sealant has a thickness of from 0.75 mil to 1.5 mil.

17. The package film of claim 13, wherein the first foil layer is coated with primer or indicia.

18. A die cut lid comprising the package film of claim 13.

19. The die cut lid of claim 18, wherein the die cut lid is embossed.

20. A package film comprising
a first foil layer having a thickness of from 0.25 mil to 0.5 mil,
a second foil layer having a thickness of from 0.25 mil to 0.5 mil,
a multilayer structure positioned between the first foil layer and the second foil layer, wherein the multilayer structure has a thickness of from 0.75 mil to 2 mil and comprises (a) a high modulus layer comprising a biaxially oriented nylon film or a biaxially oriented polyethylene terephthalate film, the high modulus layer having a secant modulus in each of the machine direction and the transverse direction of greater than 120,000 psi or having an elongation at break in each of the machine direction and the transverse direction of less than 150% and (b) a multilayer bulk layer comprising processing aid, low density polyethylene (LDPE) and ethylene acrylic acid copolymer (EAA); wherein the high modulus layer is positioned interior the multilayer bulk layer and the multilayer bulk layer is positioned exterior the high modulus layer;
an adhesive layer positioned between the second foil layer and the high modulus layer, wherein the adhesive layer is directly attached to the second foil layer and the high modulus layer; and
an extrusion coated sealant, wherein the extrusion coated sealant is positioned interior the second foil layer.

* * * * *

UNITED STATES PATENT AND TRADEMARK OFFICE
CERTIFICATE OF CORRECTION

| | | |
|---|---|---|
| PATENT NO. | : 11,897,231 B2 | Page 1 of 1 |
| APPLICATION NO. | : 16/309538 | |
| DATED | : February 13, 2024 | |
| INVENTOR(S) | : Ross K. Gruetzmacher and Brent G. Martins | |

It is certified that error appears in the above-identified patent and that said Letters Patent is hereby corrected as shown below:

In the Specification

Column 2, Line 8 After "from", insert -- 0.75 --, therefor.

Column 3, Line 64 Before "mil", insert -- 0.35 --, therefor.

Column 5, Line 11 Delete "%" and insert -- "70-130 %" --, therefor.

Column 7, Line 9 Delete "%" and insert -- "5%" --, therefor.

Column 14, Table 2, Row 1, Column 5 Delete "Initia" and insert -- "Initial" --, therefor.

Signed and Sealed this
Twentieth Day of May, 2025

Coke Morgan Stewart
*Acting Director of the United States Patent and Trademark Office*